(12) United States Patent
Malloy

(10) Patent No.: US 8,366,431 B2
(45) Date of Patent: Feb. 5, 2013

(54) PARTIAL DIE PROCESS FOR UNIFORM ETCH LOADING OF IMPRINT WAFERS

(75) Inventor: Matt Malloy, Albany, NY (US)

(73) Assignee: Sematech, Inc., Austin, TX (US)

(*) Notice: Subject to any disclaimer, the term of this patent is extended or adjusted under 35 U.S.C. 154(b) by 291 days.

(21) Appl. No.: 12/759,489

(22) Filed: Apr. 13, 2010

(65) Prior Publication Data
US 2011/0248384 A1 Oct. 13, 2011

(51) Int. Cl.
*B29C 59/02* (2006.01)
(52) U.S. Cl. .......................... 425/345; 425/385
(58) Field of Classification Search ............ 425/345, 425/385
See application file for complete search history.

(56) References Cited

U.S. PATENT DOCUMENTS

| | | | |
|---|---|---|---|
| 7,179,079 B2 | 2/2007 | Sreenivasan et al. | 425/385 |
| 7,699,598 B2 | 4/2010 | Sreenivasan et al. | 425/385 |
| 7,997,890 B2 * | 8/2011 | Heidari et al. | 425/385 |
| 8,144,309 B2 * | 3/2012 | Wuister et al. | 355/72 |

OTHER PUBLICATIONS

Sreenivasan et al., "Status of the UV Nanoimprint Stepper Technology for Silicon IC Fabrication," Presented Feb. 23, 2010.

* cited by examiner

*Primary Examiner* — Minh-Loan T Tran
(74) *Attorney, Agent, or Firm* — Fulbright & Jaworski L.L.P.

(57) ABSTRACT

Methods, systems, and devices which result from, or facilitates, convenient processing of partial dies of a semiconductor chip in a lithography process are disclosed. Embodiments utilize an exposure through an imprint-style template which does not come in physical contact with the partial die. In one embodiment, a semiconductor process is disclosed which has at least one full die and at least one partial die. The semiconductor chip is fabricated, in part, by using an etching process which utilizes an imprint template configured to be exposed to the at least one full die when the imprint template is in contact with resist which has been dispensed onto the at least one full die. Further, at least one partial die of the semiconductor chip is configured to be exposed to the imprint template without the template contacting resist dispensed onto the at least one partial die.

8 Claims, 6 Drawing Sheets

PARTIAL DIE PROCESS FOR UNIFORM ETCH LOADING OF IMPRINT WAFERS

TECHNICAL FIELD

This invention relates to semiconductor devices and fabrication processes thereof, and more particularly relates to an apparatus system and method providing for convenient processing of partial dies of a semiconductor chip.

BACKGROUND

In general, a wafer being processed in lithography has one or more round edges, while imprint fields on the wafer are rectangular. As a result, when processing the edge of the wafer, portions of the rectangular fields extend off of the edge of the wafer. This gives rise to many issues when attempting to maintain a clean and efficient fabrication process.

In many cases, it is possible that a field actually contains an array of usable chips that are much smaller than that field size, and such a smaller array may be processed on the edge of the wafer in order to maximize the use of the wafer area. Conversely, in some lithographic processes it may be desirable to process the edge with the goal of assuring edge conformity, and not necessarily to yield usable chips. Edge conformity may be important because many fabrication processes rely on the full wafer having patterning or material extending to the edges. When edge conformity is lacking, it can lead to problems in subsequent processes like etching, for instance, where the recipes are tuned to having a full wafer. In some cases, nonconformity may become worse with each subsequent step in the fabrication process.

Imprint-based systems, and particularly nanoimprint systems, are now being utilized in advanced lithography processes because advances in imprint-based technology have yielded resolution capabilities superior to that of projection systems. These systems generally function by dispensing resist onto a die area and physically stamping the area with an imprint template. However, problems with these systems may occur because in order to print edge die, the imprint template must extend off the edge of the wafer. This causes problems when balancing the forces applied for the physical contact due to the fact that portions of the imprint template are in contact with a semiconductor wafer, while other portions of the template extend off of the edge of the wafer and do not contact anything. Moreover, issues arises at the wafer edge when part of the template is in contact with the fluid on the wafer, and part of it is not in contact with anything. This border is a source or particles which can easily contaminate the template. As such, even after one contact, it is very likely that particulates and debris from the edge of the wafer will stick on the template, rendering the template insufficient for further use absent a cleaning process. Accordingly, current imprint-based systems do not provide the ability to process edge areas in a manner which yields sufficient edge conformity without causing significant time and resource complications.

BRIEF SUMMARY OF THE INVENTION

The present disclosure provides for methods, systems, and devices which result from, or facilitates, convenient processing of partial dies of a semiconductor chip in a lithography process. Embodiments utilize an exposure through an imprint-style template which does not come in physical contact with the partial die. In one embodiment, a semiconductor chip is disclosed which has at least one full die and at least one partial die. The semiconductor chip is fabricated, in part, by using an imprint template configured to be exposed to the at least one full die when the imprint template is in contact with resist which has been dispensed onto the at least one full die. Further, at least one partial die of the semiconductor chip is configured to be exposed to the imprint template without the template contacting resist dispensed onto the at least one partial die.

In more detailed embodiments, the at least one full die and at least one partial die are configured to maintain wafer uniformity during etching or other subsequent processing. This may include maintaining a substantially similar volume of cured resist on the partial die as would have remained in the event that an imprint exposure were utilized on the partial die. Further embodiments may result in an exposed pattern on the partial die which does not fully match the pattern of the imprint template.

Embodiments which include methods for fabricating a semiconductor chip are also described. The methods in the disclosed embodiments substantially include the steps necessary to carry out the functions presented with respect to the embodiments discussed herein. In one embodiment a method includes configuring a template to physically imprint resist dispensed onto one or more dies on a semiconductor chip. The method further includes exposing resist dispensed on an edge die of the semiconductor chip to the configured template, where exposing the edge die is done without making physical contact by the template.

In another embodiment a method may include calculating resist dispense requirements for a partial die of the semiconductor chip. The method further includes dispensing resist on the partial die of the semiconductor chip in accordance with the calculated requirements and exposing the dispensed resist through an imprint template without contacting the dispensed resist. Further, in this embodiment, the calculated dispense requirements are configured to provide sufficient resist to maintain etch uniformity with one or more full dies of the semiconductor chip after the exposure of the dispensed resist.

Embodiments may also be in the form of an apparatus configured to make or process the above semiconductor devices or to carry out the above methods. For example, one embodiment may include an imprint lithography tool configured to dispense resist onto one or more die areas of a semiconductor chip and to imprint and expose a template on one or more full die areas of the semiconductor chip. The imprint lithography tool may be further configured to dispense a calculated amount of imprint resist onto a partial die area of the semiconductor chip and expose the imprint template to the partial die area without making physical contact with the calculated resist dispensed onto the partial die area.

The terms "partial die" and "edge die" are used herein interchangeably at times. Each term corresponds to a die area wherein only part of the area, or none of the area, will be utilized for fabricating functional components. It is noted however, that an edge die refers to a partial die which is on an edge of the semiconductor chip or wafer.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 15%, preferably within 10%, more preferably within 5%, and most preferably within 1% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1:
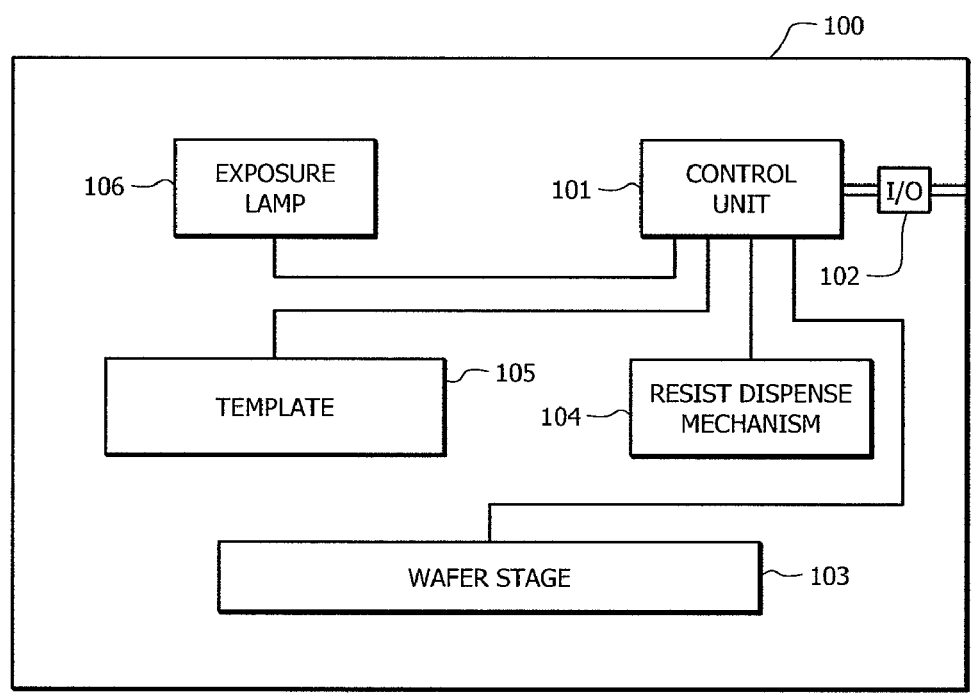
FIG. 1 illustrates a block diagram of an imprint lithography system in accordance with an embodiment of the present invention.

FIG. 1 illustrates a block diagram of an example embodiment of an imprint lithography system 100. Imprint lithography system 100 may be implemented as a nanoimprint system or any other type of imprint system capable of implementing the described teachings. An example system may be the Imprio® 300 by Molecular Imprints, Inc. Imprint lithography system 100 includes a control unit 101 which may be configured to control various aspects of lithography system 100. Control unit 101 may interface with input/output unit 102 which may be connected to other internal or external computing devices, displays, printers, or user interfaces such as keyboards, mice, and the like (not shown). Control unit 101 and the interfacing computing devices may include processors and include, or have access to, various computer readable media which may contain instructions for one or more processors controlling aspects of system 100 for implementing the described embodiments. In this manner, a user may customize or program control unit 101 to carry out desired lithographic functions including the functionality described herein. Control unit 101 may also include a plurality of control lines connected to other portions of lithography system 100 to facilitate communication there between.

A wafer may be loaded onto wafer stage 103. Control unit 101 may then cause lithography system 100 to calibrate the system based on the wafer layout, e.g., calibrate according to locations of full dies, partial dies/edge dies, conduct wafer alignment, and the like. Once a wafer is loaded, lithography system 100 may then dispense resist onto the wafer, or the resist may be applied to the wafer prior to loading the wafer into lithography system 100. Resist dispensing may be accomplished using any means known in the art. In one embodiment, resist dispense mechanism 104 is utilized for distribution of resist material. In some embodiments the resist dispense mechanism may be implemented as a print head configured to place droplets of resist under the control of control unit 101. Template 105 may then imprint a desired pattern into the dispensed resist over one or more fields of the wafer. Template 105 may be implemented by any type of imprint template, such as a nanoimprint template, and the like. Exposure lamp 106 is utilized to expose the imprinted pattern to the resist on the wafer.

Figure 2A:
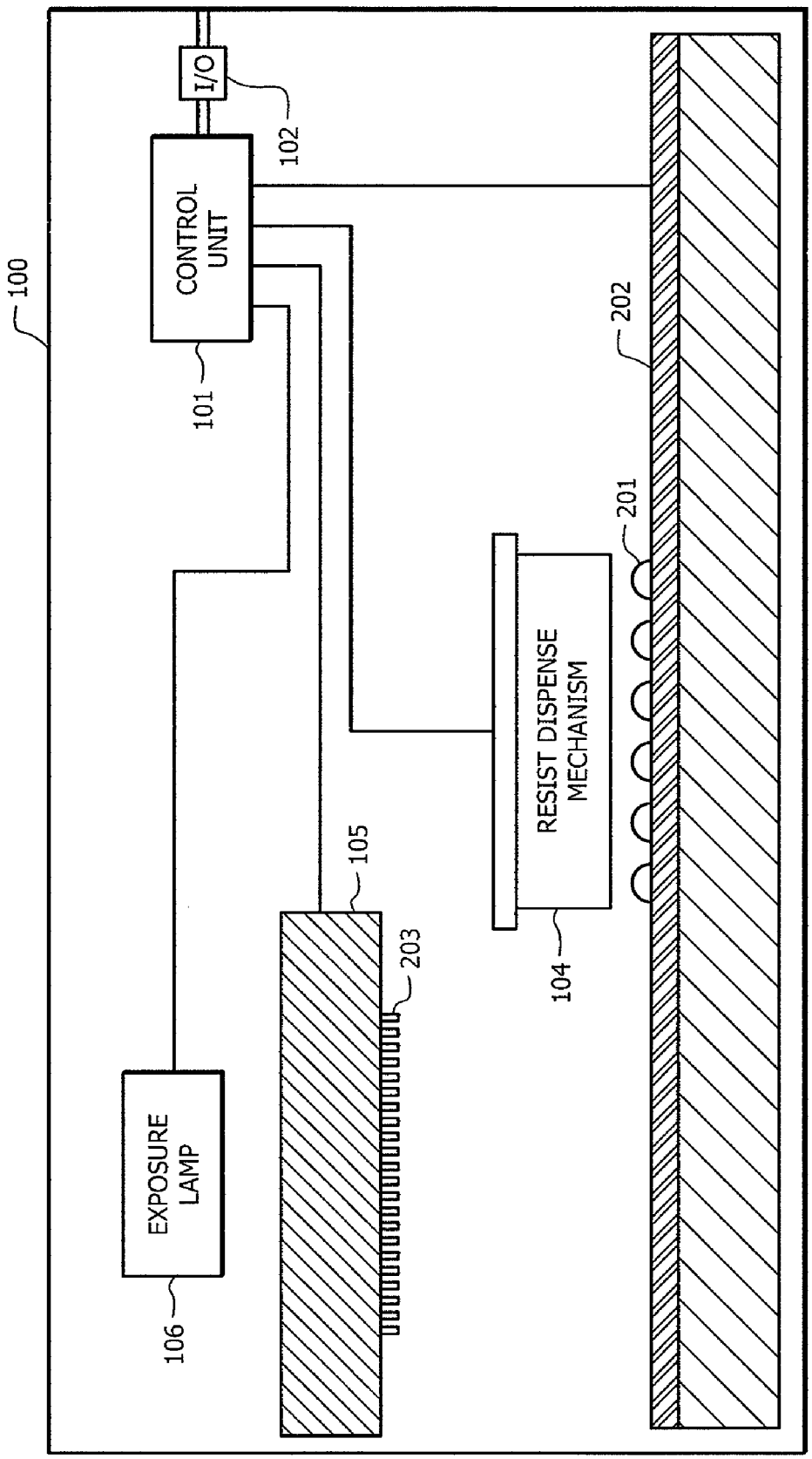
FIGS. 2A-2B illustrate an imprint process of a full die utilizing the imprint system of FIG. 1.
Figure 2B:
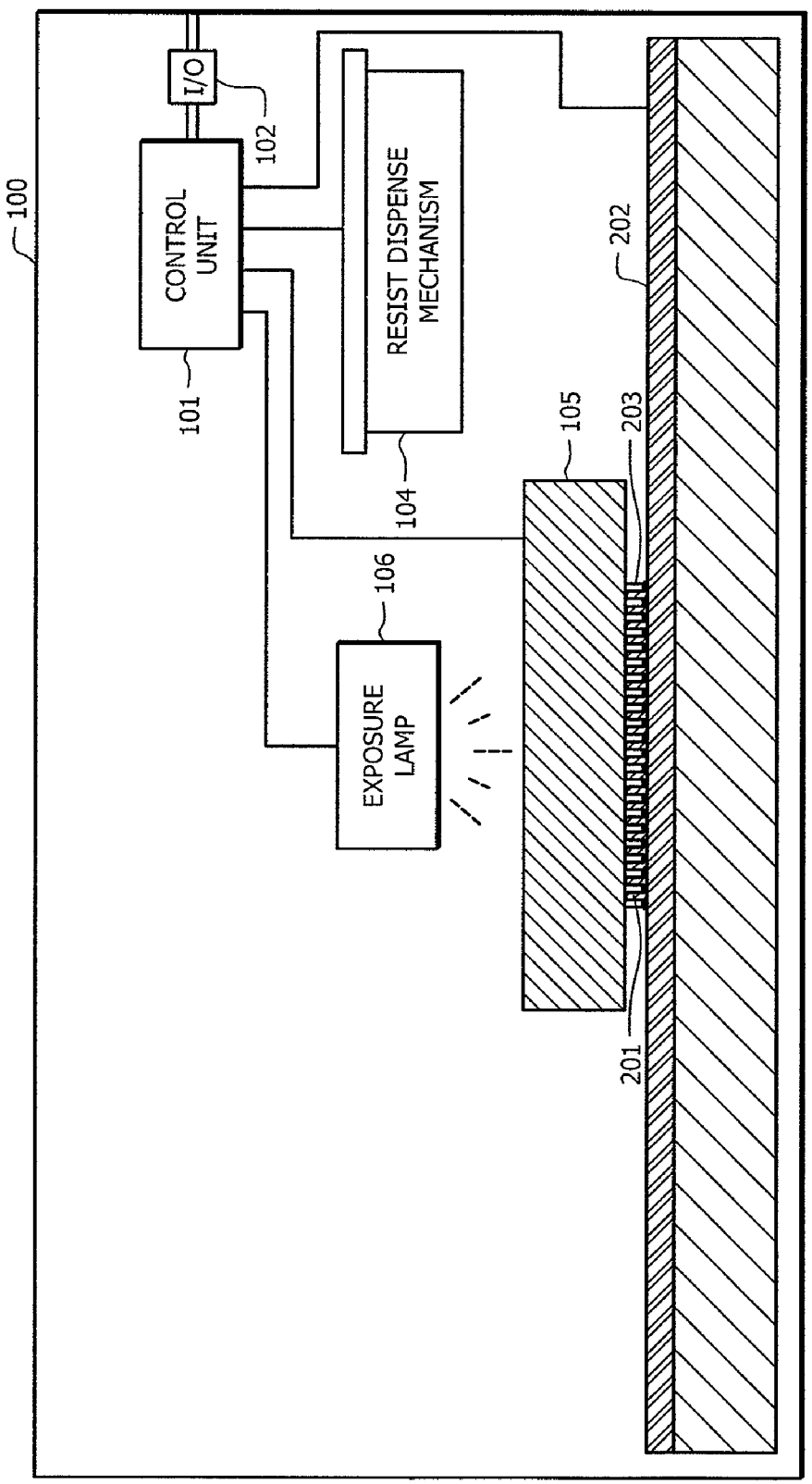

FIGS. 2A-2B illustrate an imprint process of a full die utilizing the system of FIG. 1. In FIG. 2A, resist dispense mechanism 104 dispenses resist 201 onto a given field of wafer 202. In some embodiments, the dispensed resist 201 will be in the form of small volume drops of resist sufficient to facilitate further processing. In FIG. 2B template 105 which has been configured to include pattern 203 is lowered onto the wafer field and makes physical contact with dispensed resist 201. While in contact with pattern 203, resist 201 is exposed and cured in order to take on the form of pattern 203. This exposing/curing may be done using ultraviolet (UV) light which is provided from lamp 106. When curing using UV light, it may be desirable to utilize imprint template 105 which is a clear quartz substrate so as to facilitate propagation of the light. It is noted that while the figures show that dispense mechanism 104 and template 105 in differing locations, a lithography system may utilize movements of stage 103, alone or in combination with movement of other portions of system 100, to properly orient and locate the wafer in order to dispense and imprint resist. Additionally, other forms of imprinting and curing are contemplated such as using a thermal process.

Figure 3A:
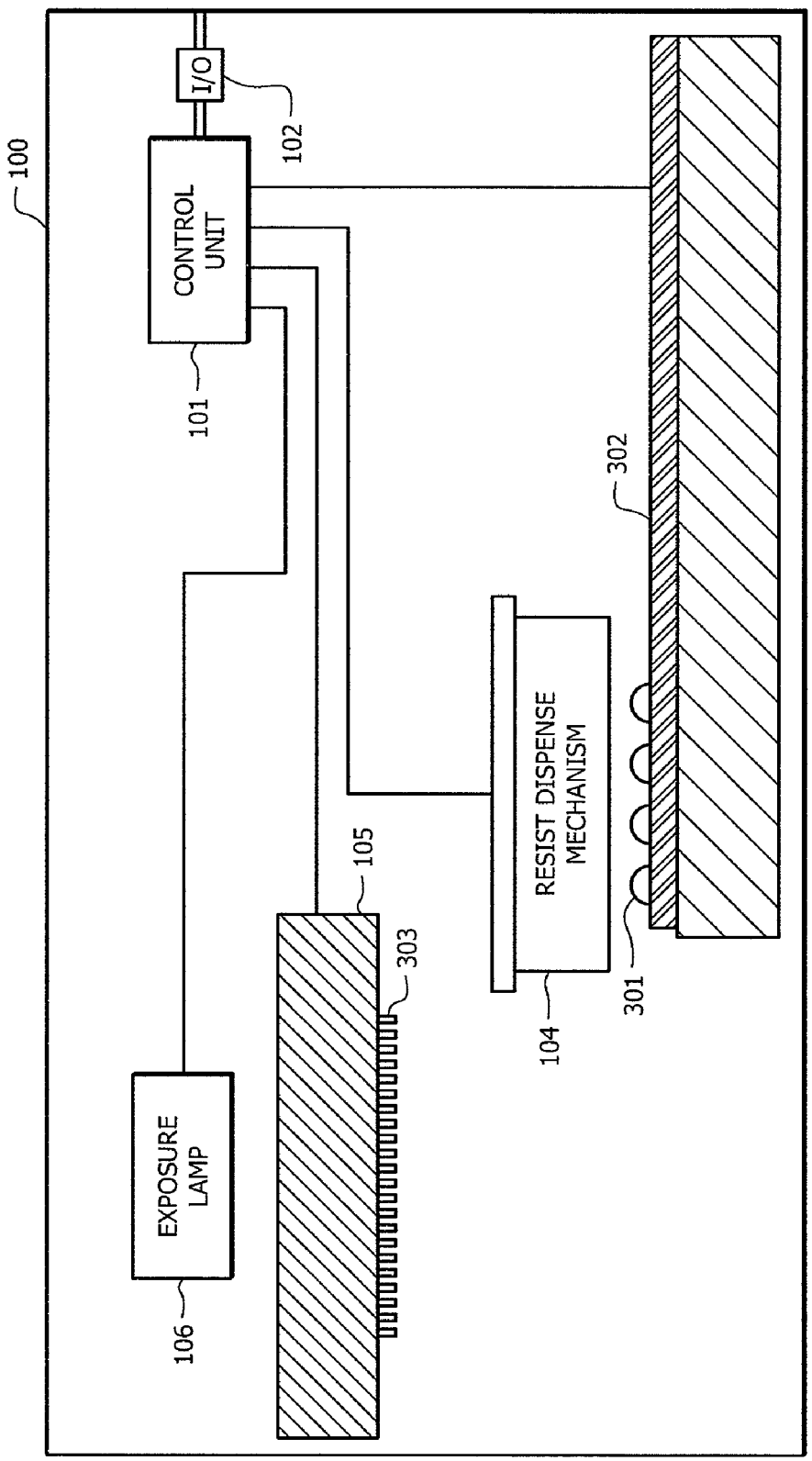
FIGS. 3A-3B illustrate a patterning process for a partial die or edge die utilizing the imprint system of FIG. 1.
Figure 3B:
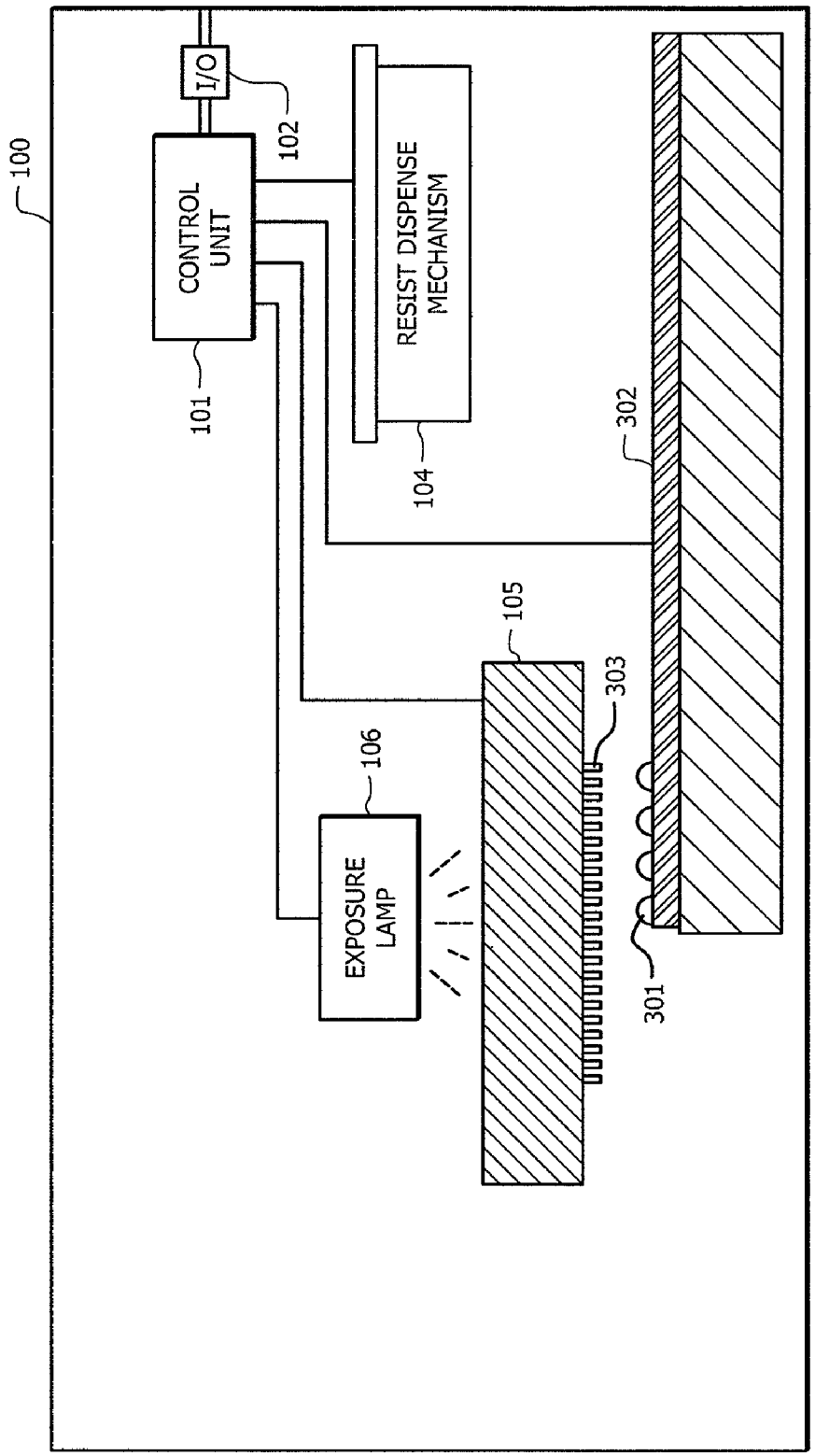

FIGS. 3A-3B illustrate a patterning process for a partial die or edge die utilizing the imprint system of FIG. 1. In this process, imprint resist dispense mechanism 104 dispenses resist 301 onto an edge die of wafer 302. The amount of resist 301 which is dispensed may be calculated internally or externally from lithography system 100. When the calculated amounts are established the resist may be dispensed under the control of control unit 101.

In some embodiments the amount of resist dispensed on the edge die of wafer 302 is calculated and configured to maintain uniformity with one or more dies of wafer 202 upon further processing the wafer. This may include configuring the resist dispense requirements for resist 301 to be proportional to the dispense requirements of other dies of wafer 302. In some embodiments, the dispense requirements may cause resist dispense mechanism 104 to dispense resist 301 onto the edge die as though it is dispensing onto a full die minus the portions where there is no wafer area. Moreover, configuring resist dispense requirements may include configuring the resist dispense requirements to be more or less than proportionate requirements for other dies of wafer 302 in order to retain a desired volume of resist on the edge die after curing. It is noted that the differences in resist dispense requirements may vary depending on particular applications, the type of exposure and templates/patterns being used, the distance between the exposed template and wafer 302, etc. It is further noted that maintaining etch uniformity may include keeping uniform resist volume for a current or future processing stages, keeping a sufficient resist volume on the partial die for current or future processing stages, etc.

FIG. 3B illustrates the exposure of resist 301 through pattern 203 and resist dispense mechanism 105 using exposure lamp 106. As illustrated, resist dispense mechanism 105 and pattern 303 are configured such that they do not make physical contact with the edge die and dispensed resist 301. Distances between imprint template 105 pattern 303 and dispensed resist 301 may vary according to particular applications. In some embodiments it may be preferable to cause imprint template 105 to be very close to dispensed resist 301 such that template 105 is within millimeter distances of resist 301.

Lamp 106 may be placed at any suitable distance with respect to template 105. The exposure may be implemented as described above using UV light, thermal methods, and the like. In some embodiments, after subsequent curing processes are implemented the same volume density of cured resist remains on the edge die as would have remained had there been a physical imprint. In other embodiments, the user may want to select the amount of volume of cured resist which remains in light of future processing steps. Further, as illustrated in FIG. 3B, the exposed resist 301 does not necessarily take on the shape of pattern 303 and may even remain substantially in droplet form.

Figure 4:
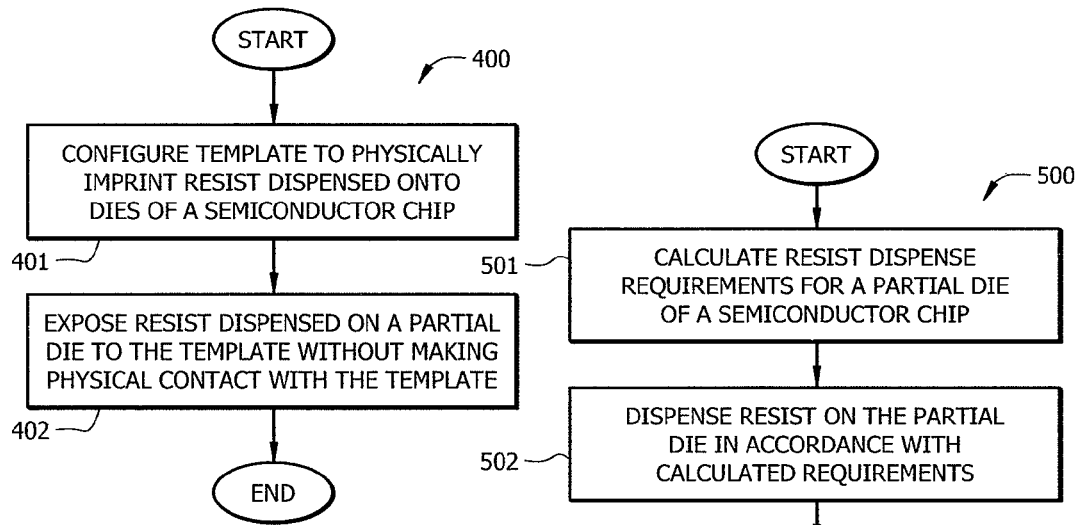
FIG. 4 is a schematic flow chart diagram illustrating one embodiment of a method for processing an edge die.

FIG. 4 illustrates a method 400 in accordance with an example embodiment. The method 400 includes configuring a template to physically imprint resist dispensed onto one or more dies on a semiconductor chip 401. The method 400 further includes exposing resist dispensed on a partial die of the semiconductor chip to the configured template without making physical contact by the template 402. This method may be implemented using an imprint lithography tool, such as the system of FIG. 1. In some embodiments, the method may include calculating resist dispense requirements for the edge die in order to maintain at uniformity with the one or more dies upon further processing of the semiconductor chip, and dispensing resist based on these calculations.

Figure 5:
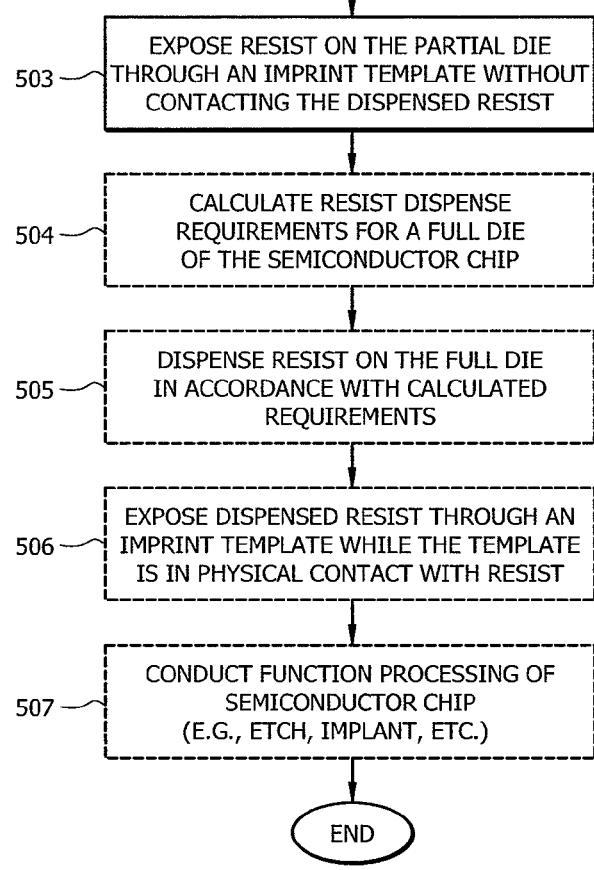
FIG. 5 is a schematic flow chart diagram illustrating one embodiment of a method for fabricating a semiconductor chip.

FIG. 5 illustrates an embodiment of the method 500 for fabricating a semiconductor chip. The method 500 includes calculating resist dispense requirements for a partial die of the semiconductor chip 501. The method 500 further includes dispensing resist on the partial die of the semiconductor chip in accordance with the calculated requirements 502 and exposing the dispensed resist through an imprint template without contacting the dispensed resist 503. Further, in this embodiment, the calculated dispense requirements are configured to provide sufficient resist to maintain etch uniformity with one or more full dies of the semiconductor chip after the exposure of the dispensed resist. As with the previous method, this embodiment may be implemented using an imprint lithography tool, such as the system of FIG. 1.

Further, the method may include calculating resist dispense requirements for a full die of the semiconductor chip 504. In accordance with these calculations, resist may be dispensed on the full die 505 and may be exposed through the imprint template while the imprint template is in contact with the dispensed resist on the full die 506. In some embodiments the method may include further processing steps 507 for the semiconductor chip such as additional curing stages, etching stages, ion implanting, and the like.

As such, method 500 provides a technique wherein a fabrication process may utilize a imprint-style photolithography device while not requiring a physical imprint on partial dies. Therefore, the method 500 provides for more convenient processing of a semiconductor chip which is fabricated using an imprint process.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A device comprising:
   a semiconductor chip having at least one full die and at least one partial die,
   wherein the semiconductor chip is fabricated, in part, by using an etching process which utilizes an imprint template configured to be exposed to the at least one full die when the imprint template is in contact with resist which has been dispensed onto the at least one full die, and
   wherein the at least one partial die is configured to be exposed to the imprint template without the template contacting resist dispensed onto the at least one partial die.

2. The device of claim 1 wherein the at least one full die and at least one partial die are configured to maintain wafer uniformity during the etching process.

3. The device of claim 2 wherein, after further processing, a substantially similar volume of cured resist remains on the partial die as would have remained in the event that an imprint exposure were utilized on the partial die.

4. The device of claim 3 wherein the pattern of the substantially similar volume of cured resist does not match the pattern of the imprint template.

5. The device of claim 1 wherein the imprint template is a nanoimprint template.

6. An apparatus comprising:
   an imprint lithography tool configured to dispense resist onto one or more die areas of a semiconductor chip and to imprint and expose a template to the one or more die areas of the semiconductor chip, the imprint lithography tool further configured to dispense a calculated amount of imprint resist onto a partial die area of the semiconductor chip and expose the imprint template to the partial die area without making physical contact with the calculated resist dispensed onto the partial die area.

7. The apparatus of claim 6 wherein the imprint lithography tool is a nanoimprint lithography tool.

8. The apparatus of claim 6 wherein the calculated dispense resist amount corresponds to an amount configured to allow the partial die area to maintain etch uniformity with the one or more full die areas.

* * * * *